United States Patent [19]

Nozaki et al.

[11] Patent Number: 4,535,423
[45] Date of Patent: Aug. 13, 1985

[54] SEMICONDUCTOR MEMORY DEVICE

[75] Inventors: Shigeki Nozaki, Kawasaki; Hatsuo Miyahara, Yokohama, both of Japan

[73] Assignee: Fujitsu Limited, Kawasaki, Japan

[21] Appl. No.: 447,660

[22] Filed: Dec. 7, 1982

[30] Foreign Application Priority Data

Dec. 7, 1981 [JP] Japan ................... 56-196465

[51] Int. Cl.³ .................................. G11C 5/10
[52] U.S. Cl. ........................... 365/51; 365/63; 365/149
[58] Field of Search ............ 365/54, 63, 72, 149, 365/226, 51

[56] References Cited

U.S. PATENT DOCUMENTS 4,139,786  2/1979  Raymond et al. ............ 365/182

Primary Examiner—James W. Moffitt
Attorney, Agent, or Firm—Staas & Halsey

[57] ABSTRACT

A semiconductor memory device which includes a plurality of memory cells each having a capacitor, and peripheral circuits of the memory cells, integrated on a semiconductor substrate. Each capacitor has a storage electrode and an electrode opposite to the storage electrode, the opposite electrode being connected to a ground line, wherein, the ground line connected to the opposite electrode of each capacitor is separated from the other ground lines connected to the peripheral circuits. All of the ground lines are connected to a common portion having an impedance lower than the impedance of each ground line, whereby data stored in the capacitors is prevented from being destroyed.

6 Claims, 4 Drawing Figures

SEMICONDUCTOR MEMORY DEVICE

BACKGROUND OF THE INVENTION

(1) Field of the Invention

The present invention relates to a semiconductor memory device having an improved ground-potential supplying system for memory cells having capacitors and for peripheral units of the memory cells.

(2) Description of the Prior Art

In general, dynamic semiconductor memory devices comprise a plurality of memory cells, each having one transistor and one capacitor connected in series between a bit line and a power supply line. The capacitor is used to store data and has two electrodes opposite to each other, one connected to the transistor and the other connected to a power supply line. Hereinafter, the electrode of the capacitor connected to the transistor is referred to as a "storage electrode", and the electrode opposite the storage electrode is referred to as an "opposite electrode". Usually, the power supply line connected to the opposite electrode of the capacitor is supplied with a voltage of, for example, 5 V, for the operation of peripheral circuits of the memory cells. This operating voltage, however easily fluctuates under the influence of external circuits. This fluctuation causes a potential fluctuation at the storage electrode of the capacitor, resulting in a possible error operation of the sense amplifier for detecting small potential differences between bit lines.

To avoid such an error operation, recent technology has replaced the use of the power supply line with a ground-potential supplying line (hereinafter simply referred to as a "ground line") connected to the opposite electrode of the capacitor. This is because the voltage fluctuation of a ground line is less than the voltage fluctuation of a power supply line. However, when the peripheral circuits operate, a current flows through the ground line, whereby the resistance of the line causes fluctuation of the potential at each point on the line. Therefore, the potential at the opposite electrode of the capacitor fluctuates even when a ground line is connected to the opposite electrode of the capacitor. Recent technology has consequently still not solved the above-mentioned problems.

SUMMARY OF THE INVENTION

It is therefore an object of the present invention to provide a semiconductor memory device having memory cells of a one-transistor one-capacitor type, in which the potential at the opposite electrode of each capacitor does not fluctuate even when the peripheral circuits operate.

In order to achieve the above object, there is provided, according to the present invention, a semiconductor memory device comprising a semiconductor substrate and a plurality of memory cells integrated on the semiconductor substrate. Each of the memory cells having a capacitor for storing data, the capacitor having a storage electrode and an electrode opposite to the storage electrode, the opposite electrode being connected to a first ground-potential supplying line. One or more peripheral units are integrated on the semiconductor substrate and arranged on the periphery of the memory cells, the peripheral units being connected to second ground-potential supplying lines. The first ground-potential supplying line is physically separated from the second ground-potential supplying lines except at a common connection portion having an impedance lower than the impedance of both the first and second ground-potential supplying lines.

BRIEF DESCRIPTION OF THE DRAWINGS

The above object and advantages as well as other features of the present invention will be better understood from the following description with reference to the accompanying drawings, in which.

DESCRIPTION OF THE PREFERRED EMBODIMENTS

Figure 1:
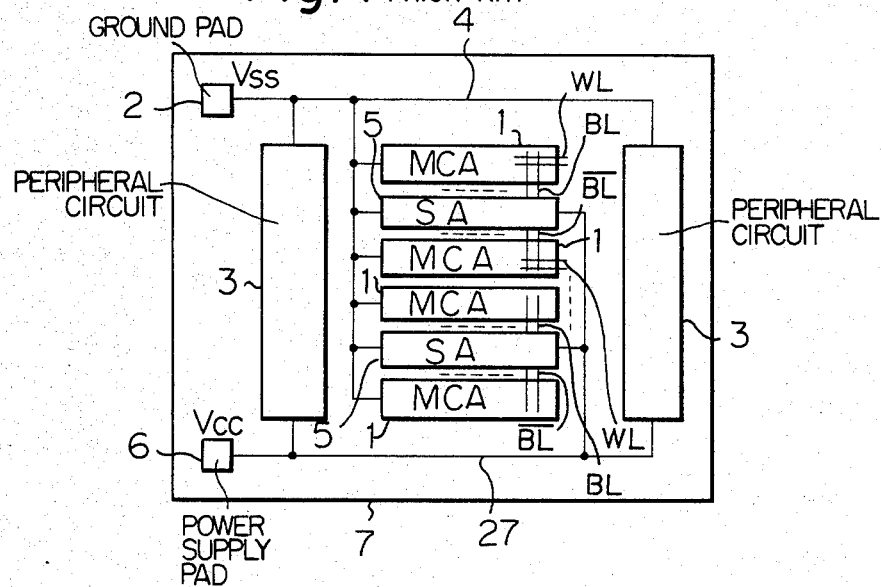
FIG. 1 is a schematic plan view of a system of a conventional dynamic random access memory (RAM)

Before describing the embodiments of the present invention, a conventional dynamic RAM and its problems will first be described with reference to FIG. 1. In FIG. 1, reference numeral 1 represents memory-cell arrays in which word lines WL and bit lines BL or $\overline{BL}$ are cross-coupled; 2 a ground pad for supplying a ground potential; 3 peripheral circuits integrated in the memory device; 4 a single ground line; 5 sense amplifiers connected to the bit lines BL and $\overline{BL}$; 6 a power supply pad for supplying an operating potential; and 7 a memory chip of the memory device. The ground line 4 is connected to the ground pad. The ground line 4 is branched to connect the memory-cell arrays 1, the peripheral circuits 3, and the sense amplifiers 5. When the peripheral circuits operate, the potential of the ground line 4 fluctuates because currents flow through the resistance of the ground line. The ground line 4 is connected to opposite electrodes of the capacitors. Therefore, the potential at the opposite electrodes of the capacitors easily fluctuates, so that the content of the memory cells is often destroyed. Embodiments of the present invention will now be described.

Figure 2:
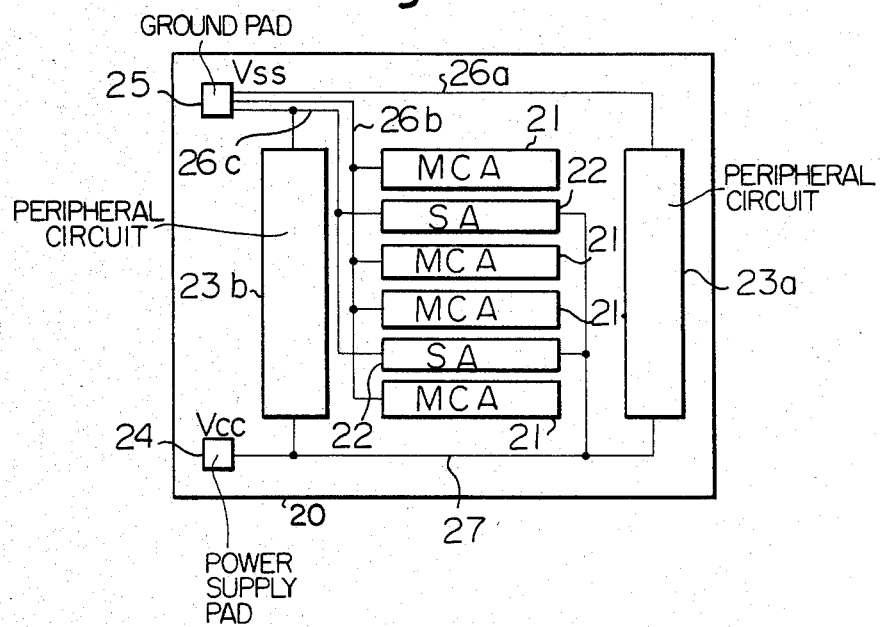
FIG. 2 is a schematic plan view of a system of a dynamic RAM according to an embodiment of the present invention.

FIG. 2 is a first embodiment of the present invention. In FIG. 2, a memory chip 20 of a dynamic RAM has memory-cell arrays 21, sense amplifiers 22, peripheral circuits 23a and 23b such as decoders, a power-supply pad 24 for receiving an operating voltage and supplying it through a power-supply line 27 to the sense amplifiers or the peripheral circuits 23a and 23b, and a ground pad 25 for receiving a ground voltage and supplying it to the memory-cell arrays, sense amplifiers, or peripheral circuits, mounted thereon. The difference between the structures of FIGS. 1 and 2 is that, in FIG. 2, there are separate ground lines 26a, 26b, and 26c. The first ground line 26a is connected between the ground pad 25 and the peripheral circuit 23a which is placed furthest from the ground pad 25. The second ground line 26b is connected between the ground pad 25 and the memory-cell arrays 21. The third ground line 26c is connected between the ground pad 25 and the peripheral circuit 23b, which is placed nearest to the ground pad 25, and between the ground pad 25 and the sense amplifiers 22. In this embodiment, the ground pad 25 is a common connection portion of the three ground lines 26a, 26b, and 26c.

Figure 3:
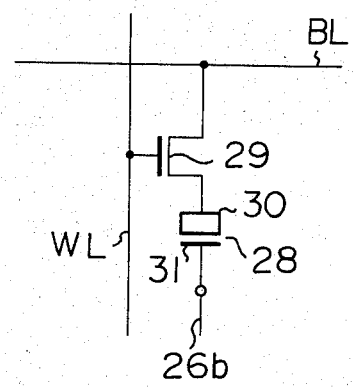
FIG. 3 is a circuit diagram of a memory cell in the memory of FIG. 2.

FIG. 3 is a circuit diagram of a memory cell included in the memory-cell arrays 21 of FIG. 2. As is well known, in FIG. 3, a memory cell MC comprises a capacitor 28 for storing data and a metal-oxide semiconductor (MOS) transistor 29 acting as a transfer gate. The transistor 29 has a drain connected to a bit line BL, a gate connected to a word line, and a source connected to a storage electrode 30 of the capacitor 28. The capacitor 28 is made of a depletion-type MOS transistor having a source and drain connected together to form the storage electrode 30, and also having a gate acting as the opposite electrode 31. The opposite electrode 31 is connected to the second ground line 26b. Since the MOS transistor is of a depletion type, 28 can always act as a capacitor even if its gate is connected to the ground line 26a.

Because the second ground line 26b is separated from the other ground lines, neither the operation of the peripheral circuit 23a or 23b nor the resistance of the first ground line 26a or the third ground line 26c influence the potential of the second ground line 26b. Therefore, the potential at the opposite electrode 31 of the capacitor 28 does not fluctuate due to the operation of the peripheral circuits 23a and 23b or due to the resistance of the ground line 26a or the ground line 26c. Thus, according to this embodiment, the sense amplifiers 22 are prevented from causing an error operation.

Without the above-mentioned specific wirings for the ground lines, the potential of the opposite electrode 31 often fluctuates from 0 V to, for example 2.5 V or more due to the operation of the peripheral circuits 23a and 23b or due to the resistance of the ground line 26a or the ground line 26c. When the capacitor stores no charge, the potential of the storage electrode 30 is boosted by the rise of the potential of the opposite electrode 31. In this situation, when the transistor 29 is selected to read the data stored in the capacitor 28, the bit line BL becomes unnecessarily higher than 2.5 V. The corresponding sense amplifier 22 detects the potential difference between the bit line BL and $\overline{BL}$. In this case, the sense amplifier 22 erroneously detects the potential of the bit line BL higher than the potential of the bit line $\overline{BL}$. Thus, in this case, the sense amplifier 22 causes an error operation.

Figure 4:
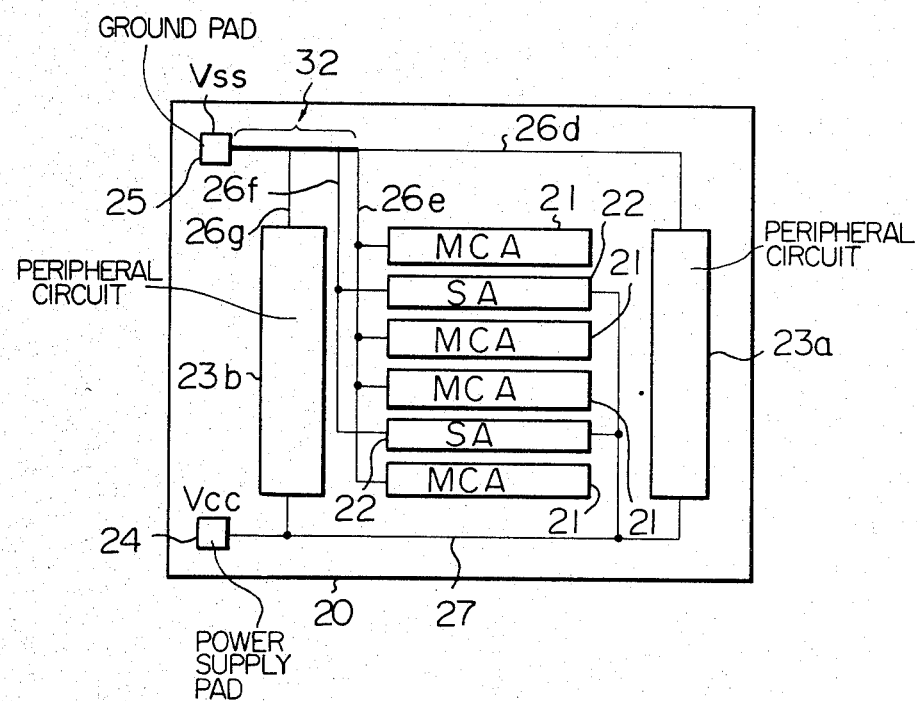
FIG. 4 is a schematic plan view of a dynamic RAM according to an embodiment of the present invention.

FIG. 4 is a second embodiment of the present invention. In FIG. 4, the same portions as in FIG. 2 are represented by the same reference numerals. The differences between FIGS. 2 and 4 are that, instead of providing the separate ground lines 26a, 26b, and 26c, in FIG. 4, a common-wiring line 32 is connected to the ground pad 25. The ground lines 26d through 26g are branched from the common-wiring line 32. That is, between the common-wiring line 32 and the peripheral circuit 23a, a first ground line 26d is connected; between the common-wiring line 32 and the memory-cell arrays 21, a second ground line 26e is connected; between the common-wiring line 32 and the sense amplifiers 22, a third ground line 26f is connected; and, between the common-wiring line 32 and the peripheral circuit 23b, a fourth ground line 26g is connected. The common-wiring line 32 is made of an electrical conductor and has a line width much larger than the line width of the ground line 26d, 26e, 26f, or 26g.

In this embodiment also, since the common-wiring line 32 has the above-mentioned structure, the potential at the opposite electrode 31 of the capacitor 28 (FIG. 2) does not seriously fluctuate even when the peripheral circuit 23a operates or even when a current flows through the resistance of the ground line 26d.

From the foregoing description, it will be apparent that, according to the present invention, since ground lines connected commonly to a ground pad are separately provided or since the ground lines are connected to a common-wiring line having a large line width and connected to a ground pad, the potential at each opposite electrode of a capacitor in each memory cell does not seriously fluctuate due to the operation of the peripheral circuits or due to a current flowing through resistances of the ground lines, resulting in a high reliability in the operation of sense amplifiers. Accordingly, the data stored in dynamic memory cells are prevented from being destroyed.

The present invention is not restricted to the illustrated embodiments. Various changes and modifications are possible without departing from the spirit of the present invention. For example, in FIG. 2, the first ground line 26a and the third ground line 26c may be formed by a single ground line separated from the second ground line 26b. Also, in FIG. 4, the common-wiring line 32 can have a wider width or longer length than that illustrated.

We claim:

1. A semiconductor memory device comprising:
   a semiconductor substrate;
   a first ground-potential supplying line and second ground-potential supplying lines having impedances and formed on said substrate, said first ground-potential supplying line physically separated from said second ground-potential supplying lines except at a common connection portion having an impedance lower than the impedance of each of said first and second ground-potential supplying lines;
   a plurality of memory cells integrated on said semiconductor substrate, each of said memory cells having a capacitor for storing data, said capacitor having a storage electrode and an electrode opposite to said storage electrode, said opposite electrode being connected to said first ground-potential supplying line; and
   one or more peripheral units integrated on said semiconductor substrate and arranged on the periphery of said memory cells, said peripheral units being connected to said second ground-potential supplying lines.

2. A semiconductor memory device as set forth in claim 1, wherein said common connection portion comprises a ground pad provided on said semiconductor substrate, said ground pad operatively connected to receive a ground voltage.

3. A semiconductor memory device as set forth in claim 2, wherein said common connection portion further comprises a common-wiring line connected to said ground pad, said first ground-potential supplying line and said second ground-potential supplying lines being branched from said common-wiring line, said common-wiring line having a line width larger than the line width of said first ground-potential supplying line or each of said second ground-potential supplying lines.

4. A semiconductor memory device as set forth in claim 3, wherein said capacitor is formed by a depletion-type MOS transistor.

5. A semiconductor memory device having first and second peripheral circuits, memory cell arrays operatively connected to the first and second peripheral circuits and sense amplifiers respectively disposed between two of the memory cell arrays, comprising:
- a ground pad;
- a common wiring line operatively connected to said ground pad;
- a first ground line operatively connected between said common-wiring line and the first peripheral circuit;
- a second ground line operatively connected between said common-wiring line and the memory cell arrays;
- a third ground line operatively connected between said common-wiring line and the sense amplifiers; and
- a fourth ground line operatively connected between said common-wiring line and the second peripheral circuit.

6. A semiconductor memory device as set forth in claim 5, wherein said common-wiring line has a width greater than the width of said first through fourth ground lines.

* * * * *